US012701929B2

(12) United States Patent
Huang et al.

(10) Patent No.: US 12,701,929 B2
(45) Date of Patent: Aug. 4, 2026

(54) PCM DEVICE

(71) Applicant: Taiwan Semiconductor Manufacturing Company, Ltd., Hsinchu (TW)

(72) Inventors: Chang-Chih Huang, Taichung (TW); Han-Yu Chen, Hsinchu (TW); Yu-Sheng Chen, Taoyuan (TW); Kuo-Chyuan Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 838 days.

(21) Appl. No.: 17/853,890

(22) Filed: Jun. 29, 2022

(65) Prior Publication Data

US 2024/0008373 A1 Jan. 4, 2024

(51) Int. Cl.
 *H10N 70/20* (2023.01)
 *H10N 70/00* (2023.01)
(52) U.S. Cl.
 CPC ......... *H10N 70/231* (2023.02); *H10N 70/023* (2023.02); *H10N 70/841* (2023.02); *H10N 70/8613* (2023.02); *H10N 70/883* (2023.02)
(58) Field of Classification Search
 CPC ..................................................... H10N 70/231
 See application file for complete search history.

(56) References Cited

U.S. PATENT DOCUMENTS

| | | | | |
|---|---|---|---|---|
| 9,368,720 B1 * | 6/2016 | Moon | ................ | H10N 70/8828 |
| 10,454,027 B1 | 10/2019 | Howard et al. | | |
| 10,461,253 B1 * | 10/2019 | Slovin | ................. | H10N 70/231 |
| 2020/0058869 A1 | 2/2020 | Slovin et al. | | |

FOREIGN PATENT DOCUMENTS

CN 114188476 A 3/2022

OTHER PUBLICATIONS

First office action received in the counterpart Taiwan application 112123312, mailed on Jun. 11, 2024.

* cited by examiner

*Primary Examiner* — Douglas M Menz
(74) *Attorney, Agent, or Firm* — KILPATRICK TOWNSEND & STOCKTON LLP

(57) ABSTRACT

In various embodiments, an improved structure for a PCM device is provided. The improved structure is configured to help prevent heat dissipation. In one example, the PCM device is an PCM RF Switch, which has a substrate, a heater, a dielectric/insulator layer, oxidation layers, electrodes, a PCM region, and/or any other components. The oxidation layers are configured to help prevent heat dissipation from the heater.

20 Claims, 12 Drawing Sheets

PCM DEVICE

BACKGROUND

Phase-change materials (PCM) are materials that exist in an amorphous phase and in a crystalline phase. In this sense, almost any material is a phase change material. However, as understood in the art, phase change material needs to fulfill several properties that depend on the specific application. Since the first commercial application of phase change materials was in the rewritable optical data storage phase, change materials were optimized with respect to their optical properties such as strong optical contrast at the required wavelength. For PCM, other material properties are important, and a different material optimization is required. Example phase change material properties includes low melting temperature, relatively high crystallization temperature, low thermal conductivity, high activation energy for crystallization, relatively high resistance, stable resistance levels, high crystallization speed, and/or any other properties.

It is known that the most stable crystalline phase in Ge—Sb—Te alloys can be obtained for distorted rock-salt like structures. Many phase change materials of the Ge—Sb—Te system, such as $Ge_1Sb_4Te_7$, $Ge_1Sb_2Te_4$, $Ge_2Sb_2Te_5$ and $Ge_3Sb_2Te_6$, exhibit in addition to the amorphous-crystalline phase transition a metal-insulator transition upon further annealing.

Radio frequency (RF) switch can be made using PCM and compatible with silicon-germanium material-based semiconductor devices such as CMOS. Such a switch typically has a chalcogenide type switching layers similar to that used in phase-change memories. The PCM RF switch typically operates over a range of frequencies spanning megahertz to millimeter-wave frequencies. Its use can result in low insertion loss and small device size. Applications could include mobile equipment, base stations, and millimeter-wave communications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
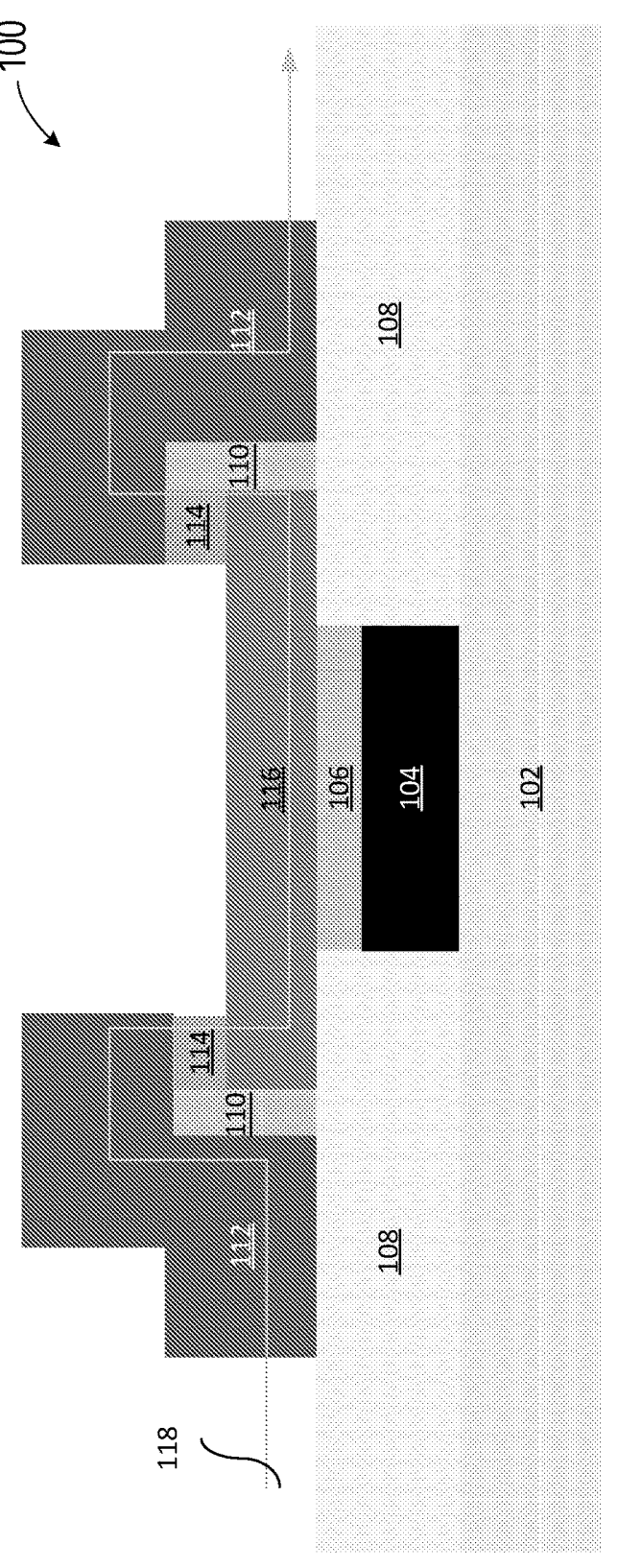
FIG. 1A illustrates one example of a PCM device in accordance with one embodiment.
FIG. 1B illustrates an alternative implementation to the one shown in FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Throughout this disclosure, various chemical elements are described in full names and/or symbols. For accuracy and completeness, the following chemical elements table is provided for a given chemical element described in the present disclosure:

| CHEMICAL ELEMENTS | | | |
|---|---|---|---|
| ELEMENT | SYMBOL | ATOMIC NUMBER | ATOMIC WEIGHT |
| actinium | Ac | 89 | (227) |
| aluminum | Al | 13 | 26.98154 |
| americium | Am | 95 | (243) |
| antimony | Sb | 51 | 121.760 |
| argon | Ar | 18 | 39.948 |
| arsenic | As | 33 | 74.92160 |
| astatine | At | 85 | (210) |
| barium | Ba | 56 | 137.33 |
| berkelium | Bk | 97 | (247) |
| beryllium | Be | 4 | 9.012182 |
| bismuth | Bi | 83 | 208.98040 |
| bohrium | Bh | 107 | (264) |
| boron | B | 5 | 10.81 |
| bromine | Br | 35 | 79.904 |
| cadmium | Cd | 48 | 112.41 |
| calcium | Ca | 20 | 40.078 |
| californium | Cf | 98 | (251) |
| carbon | C | 6 | 12.011 |
| cerium | Ce | 58 | 140.116 |
| cesium | Cs | 55 | 132.90545 |
| chlorine | Cl | 17 | 35.453 |
| chromium | Cr | 24 | 51.996 |
| cobalt | Co | 27 | 58.93320 |
| copernicium | Cn | 112 | (285) |
| copper | Cu | 29 | 63.546 |
| curium | Cm | 96 | (247) |
| darmstadtium | Ds | 110 | (269) |
| dubnium | Db | 105 | (262) |
| dysprosium | Dy | 66 | 162.50 |
| einsteinium | Es | 99 | (252) |
| erbium | Er | 68 | 167.259 |
| europium | Eu | 63 | 151.964 |
| fermium | Fm | 100 | (257) |
| flerovium | Fl | 114 | (289) |
| fluorine | F | 9 | 18.998403 |
| francium | Fr | 87 | (223) |
| gadolinium | Gd | 64 | 157.25 |
| gallium | Ga | 31 | 69.723 |
| germanium | Ge | 32 | 72.64 |
| gold | Au | 79 | 196.96657 |
| hafnium | Hf | 72 | 178.49 |

-continued

| CHEMICAL ELEMENTS | | | |
|---|---|---|---|
| ELEMENT | SYMBOL | ATOMIC NUMBER | ATOMIC WEIGHT |
| hassium | Hs | 108 | (277) |
| helium | He | 2 | 4.002602 |
| holmium | Ho | 67 | 164.93032 |
| hydrogen | H | 1 | 1.0079 |
| indium | In | 49 | 114.818 |
| iodine | I | 53 | 126.90447 |
| iridium | Ir | 77 | 192.217 |
| iron | Fe | 26 | 55.845 |
| krypton | Kr | 36 | 83.80 |
| lanthanum | La | 57 | 138.90547 |
| lawrencium | Lr | 103 | (262) |
| lead | Pb | 82 | 207.2 |
| lithium | Li | 3 | 6.941 |
| livermorium | Lv | 116 | (293) |
| lutetium | Lu | 71 | 174.967 |
| magnesium | Mg | 12 | 24.305 |
| maganese | Mn | 25 | 54.93805 |
| meitnerium | Mt | 109 | (268) |
| mendelevium | Md | 101 | (258) |
| mercury | Hg | 80 | 200.59 |
| molybdenum | Mo | 42 | 95.94 |
| moscovium | Mc | 115 | (289) |
| neodymium | Nd | 60 | 144.242 |
| neon | Ne | 10 | 20.180 |
| neptunium | Np | 93 | (237) |
| nickel | Ni | 28 | 58.6934 |
| nihonium | Nh | 113 | (286) |
| niobium | Nb | 41 | 92.90638 |
| nitrogen | N | 7 | 14.0067 |
| nobelium | No | 102 | (259) |
| oganesson | Og | 118 | (294) |
| osmium | Os | 76 | 190.23 |
| oxygen | O | 8 | 15.9994 |
| palladium | Pd | 46 | 106.42 |
| phosphorus | P | 15 | 30.973762 |
| platinum | Pt | 78 | 195.084 |
| plutonium | Pu | 94 | (244) |
| polonium | Po | 84 | (209) |
| potassium | K | 19 | 39.0983 |
| praseodymium | Pr | 59 | 140.90765 |
| promethium | Pm | 61 | (145) |
| protactinium | Pa | 91 | (231) |
| radium | Ra | 88 | (226) |
| radon | Rn | 86 | (222) |
| roentgenium | Rg | 111 | (280) |
| rhenium | Re | 75 | 186.207 |
| rhodium | Rh | 45 | 102.90550 |
| rubidium | Rb | 37 | 85.4678 |
| ruthenium | Ru | 44 | 101.07 |
| rutherfordium | Rf | 104 | (261) |
| samarium | Sm | 62 | 150.36 |
| scandium | Sc | 21 | 44.95591 |
| seaborgium | Sg | 106 | (266) |
| selenium | Se | 34 | 78.96 |
| silicon | Si | 14 | 28.0855 |
| silver | Ag | 47 | 107.8682 |
| sodium | Na | 11 | 22.989769 |
| strontium | Sr | 38 | 87.62 |
| sulfur | S | 16 | 32.07 |
| tantalum | Ta | 73 | 180.9479 |
| technetium | Tc | 43 | (98) |
| tellurium | Te | 52 | 127.60 |
| tennessine | Ts | 117 | (293) |
| terbium | Tb | 65 | 158.92535 |
| thallium | Tl | 81 | 204.3833 |
| thorium | Th | 90 | (232) |
| thulium | Tm | 69 | 168.93421 |
| tin | Sn | 50 | 118.71 |
| titanium | Ti | 22 | 47.867 |
| tungsten | W | 74 | 183.84 |
| uranium | U | 92 | (238) |
| vanadium | V | 23 | 50.9415 |
| xenon | Xe | 54 | 131.29 |
| ytterbium | Yb | 70 | 173.04 |

-continued

| CHEMICAL ELEMENTS | | | |
|---|---|---|---|
| ELEMENT | SYMBOL | ATOMIC NUMBER | ATOMIC WEIGHT |
| yttrium | Y | 39 | 88.90585 |
| zinc | Zn | 30 | 65.39 |
| zirconium | Zr | 40 | 91.224 |

Weights are based on naturally occurring isotope compositions scaled to $^{12}C = 12$. For elements lacking stable isotopes, the mass number of the most stable isotope is shown in parentheses.

As used herein, thermal conductivity is referred to a measurement that measures a material's ability to allow heat to pass through it via conductance. The thermal conductivity of a material is highly dependent on composition and structure. Generally speaking, dense materials such as metals and stone are good conductors of heat, while low density substances such as gas and porous insulation are poor conductors of heat.

Phase-change material (PCM) radio frequency (RF) switch (herein referred to as PCM RF switch) recently has emerged as a great communication component for 5G, millimeter-Wave (mmWave), reconfigurable RF circuits, and/or other suitable technologies. PCM RF switch has good transmission properties, nonvolatility, small footprint, high switching endurance and CMOS compatibility. PCM RF switches typically comprise a PCM connected inline by two RF ports. These switches typically use a sharp contrast in resistivity of germanium telluride (GeTe) alloy between its amorphous and crystalline states. These switches have the ability of maintaining their state, either ON or OFF, without any external bias and they combine, therefore, the benefits of mechanical relays, with the possibility of CMOS integration. The material can be crystallized by applying a thermal stimulus below its melting temperature, turning the switch in its conductive state. The device can be turned back to its insulating state with a shorter temperature pulse, with fast cooling, to melt-quench the material to its amorphous state. For enabling a PCM RF switch, temperature pulsing is typically done by using an integrated current controlled heater, and by applying appropriate current pulses, the PCM RF switch can be turned on and off.

The temperature pulse that holds the PCM RF switch at or above crystallization temperature Tc for enough time will transform the PCM into a crystalline state. Crystallization temperature Tc depends on the PCM material. For example, crystallization temperature Tc can be approximately two hundred and fifty degrees Celsius (250° C.). The amount of time needed to transform the PCM into a crystalline state depends on the material, dimensions, temperature, and/or thermal conductivity of both the PCM switch and its neighboring structures.

In various embodiments, A PCM RF switch in accordance with those embodiments is made using mechanical relays, with very high port-to-port isolation, low loss, and state stability. For mobile applications, CMOS integrated PCM RF switches are used for satellite communications. Throughout this disclosure, those embodiments are described using particular example PCM RF switches illustrated in various figures. It should be understood the present disclosure is not intended to be limited only to the particular example PCM RF switches illustrated in the figures. It is understood that various novel concepts in accordance with the present disclosure can be applied to other PCM devices that exploit threshold switching effect as described. For example, a phase-change memory device can be applied with those novel concepts.

For a typical PCM RF switch, as illustration, a heater is usually placed under the PCM material (e.g., GeTe material) in the PCM RF switch, with a very thin layer of dielectric placed between the heater and the PCM material. For example, the GeTe material is placed in-line on the RF line. When the PCM switch is in the OFF-state, the heater capacitance contributes to the OFF-state capacitance. It has been observed that blanket layer of dielectric material covering the heater in the PCM RF switch is prone to inducing dissipation of heat generated by the heater. Thus, one insight provided by the present disclosure is that the PCM RF switch's crystallization efficiency can be improved if the aforementioned induced heat dissipation is addressed.

In various embodiments, an improved structure for a PCM RF switch is provided. The improved structure is configured to address the aforementioned induced heat dissipation. FIG. 1A illustrates one example of an improved structure for a PCM RF switch 100 in accordance with one embodiment. In this example, PCM RF switch 100 has a substrate 102, a heater 104, a dielectric/insulator layer 106, oxidation layers 108, spacers 110, electrodes 112, conductors 114, a PCM region 116, and/or any other components.

The substrate 102 in this embodiment is typically thermally grown $SiO_2$, with a thickness, for example, at 100 nanometer (nm) to 800 nm. However, this is not intended to be limiting. In some other embodiments, substrate 102 is a silicon (Si), silicon-on-insulator (SOI), sapphire, complementary metal-oxide-semiconductor (CMOS), bipolar CMOS (BiCMOS), or group III-V substrate. In various implementations, PCM RF switch 100 can be provided without substrate 102. In some embodiments, substrate 102 can have multiple layers as opposed to a single layer shown in FIG. 1A.

The heater 104 in this embodiment typically comprises molybdenum (Mo) with a thickness, for example, at 150 nm. However, this is also not intended to be limiting, in various embodiments, heater 104 can comprise a metal such as tungsten (W), titanium (Ti), titanium tungsten (TiW), titanium nitride (TiN), tantalum (Ta), nickel chromium (NiCr), nickel chromium silicon (NiCrSi) and/or any other materials. For example, in one embodiment, heater 104 comprises tungsten lined with titanium and titanium nitride. In one implementation, heater can have a thickness of approximately five hundred angstroms to approximately five thousand angstroms (500 Å-5000 Å). In one embodiment, heater 104 can have a width of approximately one quarter micron to approximately two and one half microns (0.25 μm-2.5 μm).

The dielectric/insulator layer 106 in this embodiment typically comprises SiN based material such as $Si_3N_4$ having a thickness, for example, at 50 nm. However, this is also not limiting. The dielectric/insulator layer 106 arranged to prevent the electrodes 112 from coupling with other structures than the PCM region 116. In some other embodiments, dielectric/insulator layer 106 can comprise other dielectric material such as $SiO_2$.

As mentioned above, one observation from the present disclosure is that the dielectric/insulator layer 106 induces heat dissipation in the heater 104. In some other implementation, there are no oxidation layers 108 in between the electrodes 112 and dielectric/insulator layer 106. For illustration, FIG. 1B shows an example of such an implementation. Such implementation motivates a solution in accordance with the present disclosure, which is to replace portions of dielectric/insulator layer 106 with oxidation layers 108 as shown in FIG. 1A. This solution is based on replacing some portions of the dielectric/insulator layer 106 with materials having a lower thermal conductivity to better control heat dissipation from the heater 104. Ideally, the heat generated from the heater 104 is desired to be directed to heat the PCM region 116 only. Heat loss to other directions other than the PCM region is an energy waste and thus is not efficient. Thus, having an improved thermal confinement structure around the heater 104 can help reduce power supply to heat the heater 104 under a same temperature target. Thus, this solution and other solutions in accordance with the present disclosure exploit materials having lower thermal conductivity (than that of dielectric/insulator layer 106) to be arranged around the heater 104 for improved control of heat dissipation towards the PCM region 116.

In this example, the oxidation layers 108 help confine thermal energy within a zone around the heater 104 despite the heat dissipation inducement by the dielectric/insulator layer 106. This can be likened adding a layer of heat retaining fabric to a clothes to trap heat that otherwise would quickly dissipate from a person's body. It should be appreciated, as mentioned, dielectric/insulator layer 106 may comprise oxidized material such as $SiO_2$ in various implementation, but that is not the novel thermal confinement solution provided by this disclosure. Typically, the dielectric/insulator layer 106 is relatively thin, and deposited on the substrate 102 using a chemical vapor deposition (CVD) process. Its main purpose in the PCM RF switch 100 is to insulate heater 104 from contacting PCM region 116 so to avoid electrical coupling between the heater 104 and PCM region 116. Whereas the oxidation layers 108 in accordance with the present disclosure are separate and distinct from the dielectric/insulator layer 106, and, as will be described below, are deposited on the dielectric/insulator layer 106 in controlled locations, such as the ones shown in FIG. 1A, using an oxide gap-filling process to fill trenches around the dielectric/insulator layer 106 and heater 104 with oxidized material such as $SiO_2$. A thickness of the oxidation layers 108 can be larger than that of the dielectric/insulator layer 106. In this example, the thickness of the oxidation layers 108 are obtained by combining the thickness of the heater 104 and the dielectric/insulator layer 106.

It should be understood that the oxidation layers 108 and substrate 102 can have more or less the same material(s), such as $SiO_2$. However, they are not considered as the same layers in the present disclosure. As will be described below, different processes are used at different timing during fabrication of the PCM RF switch 100 to deposit substrate 102 and oxidation layers 108. It is understood that both substrate 102 and oxidation layers 108 can achieve the effect to prevent heat dissipation in the directions where they are located. In various embodiments, the oxidation layers 108 are deposited around the heat 104 after the heater 104 is deposited on the substrate 102. In those embodiments, the oxidation layers 108 are novel elements in the PCM RF switch 100 because they are deposited at locations where, otherwise, the dielectric/insulator layer 106 would be deposited as shown in FIG. 1B. As mentioned, dielectric/insulator layer 106 is not a good material for containing heat from the heater 104, and thus causes wasted heat dissipation not directed at PCM region 116. A main purpose of the dielectric/insulator layer 106 is to insulate the heater 104 from the electrical path in the PCM RF switch 100. It is observed by the present disclosure that such an insulation purpose can still be achieved for the PCM RF switch 100 while improving the heating efficiency of the heater 104 by replacing some portions of the dielectric/insulator layer 106 with the oxidation layers 108, which have lower thermal conductivity than that of the dielectric/insulator layer 106.

The PCM region 116 typically comprises PCM materials such as Germanium based materials, such as Germanium telluride (GeXTeY), germanium antimony telluride (GeXS-bYTeZ), germanium selenide (GeXSeY), or any other chalcogenide. In various embodiments, PCM region 116 is deposited on a surface of the dielectric/insulator layer 106 and oxidation layers 108 in accordance with some embodiments. A thickness of the PCM region 116 can range from 10 nm to 1000 nm in those embodiments and is not specifically limited in the present disclosure. As shown in this example, the PCM region 116 is typically arranged above the heater 104 such that the heat from the heater 104 is directed at PCM region 116 to heat the PCM region 116 for forming the electric path 118. In the case where the PCM RF switch 100 is a PCM RF switch, the electric path 118 is a RF path and electrodes 112 are RF pads.

The spacers 110 and electrodes 112 are deposited on the surfaces defined by the oxidation layers 108 and the PCM region 116 as shown. They are formed to define the electrical path 118 of the PCM RF switch 100. In some embodiments, the spacers 110 comprises SiN based materials similar to the dielectric/insulator layer 106. The electrodes 112 typically comprises metal such as Ti, Au, Tungsten (W), and/or any other suitable materials for electrical conduction. In this embodiment, conductors 114 are elements that are used to shield the PCM region 116 during the fabrication of PCM RF switch 100. In various embodiments, the conductors 114 can have similar materials to those the electrodes 112. It should be understood that the specific structure of the spacers 110, electrodes 112, and conductors 114 shown in this example is merely an illustration of a kind of PCM RF switch 100, and they are not so illustrated to limit the present disclosure. It is contemplated that one or more of spacers 110 and conductors 114 may not be present in some other embodiments. It is contemplated that in some embodiments that the location, shape, thickness, composition and/or any other aspect of spacers 110, electrodes 112, and conductors 114 are different from those illustrated and described in this example.

Figure 2A:
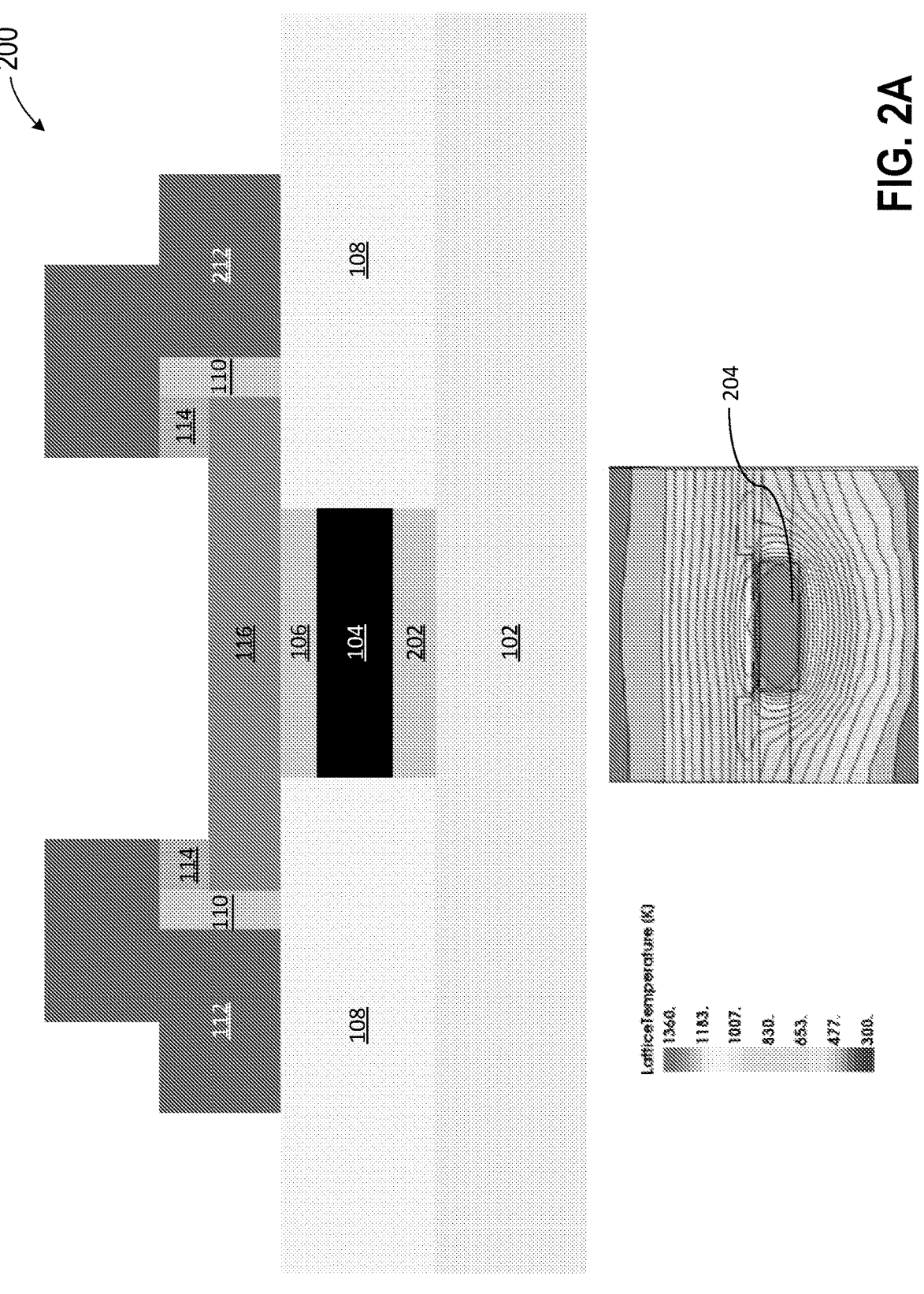
FIG. 2A illustrates one example of another PCM device in accordance with one embodiment.

Attention is now directed to FIG. 2A, which illustrates another example of a PCM RF switch 200 in accordance with the present disclosure. It will be described with reference and comparison to the PCM RF switch 100 shown in FIG. 1. As can be seen, in this example, a layer 202 is deposited between the substrate 102 and heater 104. In accordance with the present disclosure, in some embodiments, as in this example, the layer 202 is added to further prevent heat from dissipating towards directions where the PCM region 116 is not located. In this example, as shown, the layer 202 is to prevent heat from dissipating downwards. In some embodiments, the layer 202 comprises a nitride based material having a low thermal conductivity, such as TiN. At the bottom of FIG. 2A, a heat profile of PCM device 200 when the heater 104 is triggered to generate heat is shown. As can be seen, in the area 204 that corresponds the location of 116 in PCM device 200 is shown to have good thermal confinement leading to high temperature, which significant and sudden temperature drop towards the peripherals of area 204. This shows that thermal confinement elements—e.g., oxidation layers 108 and layer 202—efficiently and beneficially directs the heat towards area 204 and prevents the heat from dissipating towards other directions.

Figure 2B:
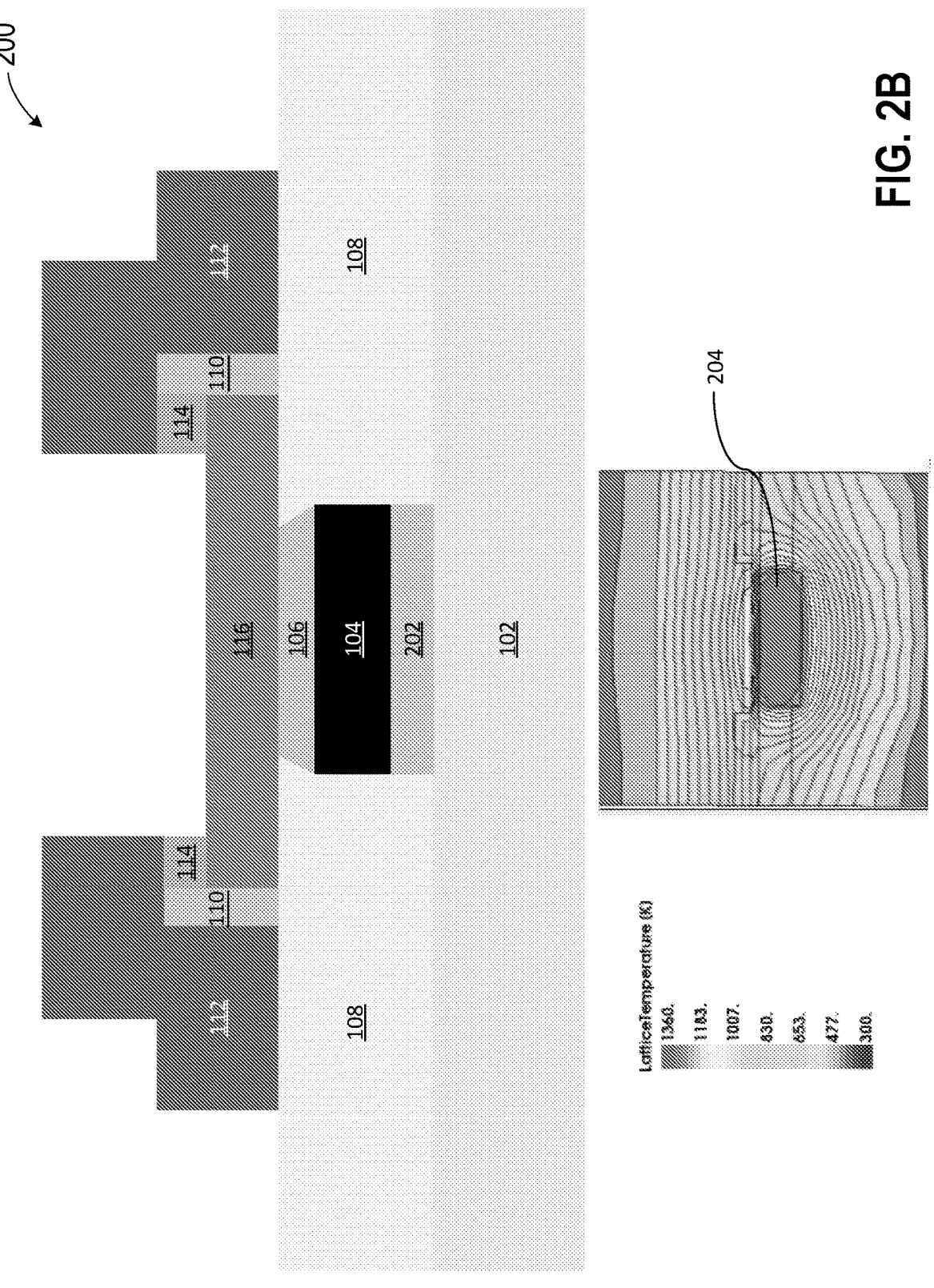

FIG. 2B illustrates another example of PCM RF switch 200 in accordance with the present disclosure. It will be described with reference and comparison to the PCM RF switch 100 shown in FIG. 1. As can be seen, in this example, the dielectric/insulator layer 106 is further configured to have a tapered shape at two sides to form a tapered dielectric/insulator layer 106. The tapered shape of the dielectric/insulator layer 106 can be obtained after the dielectric/insulator layer 106 is deposited on the heater 104. The tapered angels for dielectric/insulator layer 106 is not specifically limited in this example. The tapered dielectric/insulator layer 106 can help direct the heat from the heater 104 towards PCM region 116. At the bottom of FIG. 2B, the heat profile of the PCM device 200 in FIG. 2B shows that the heat confinement is improved.

Figures 3A, 3B:
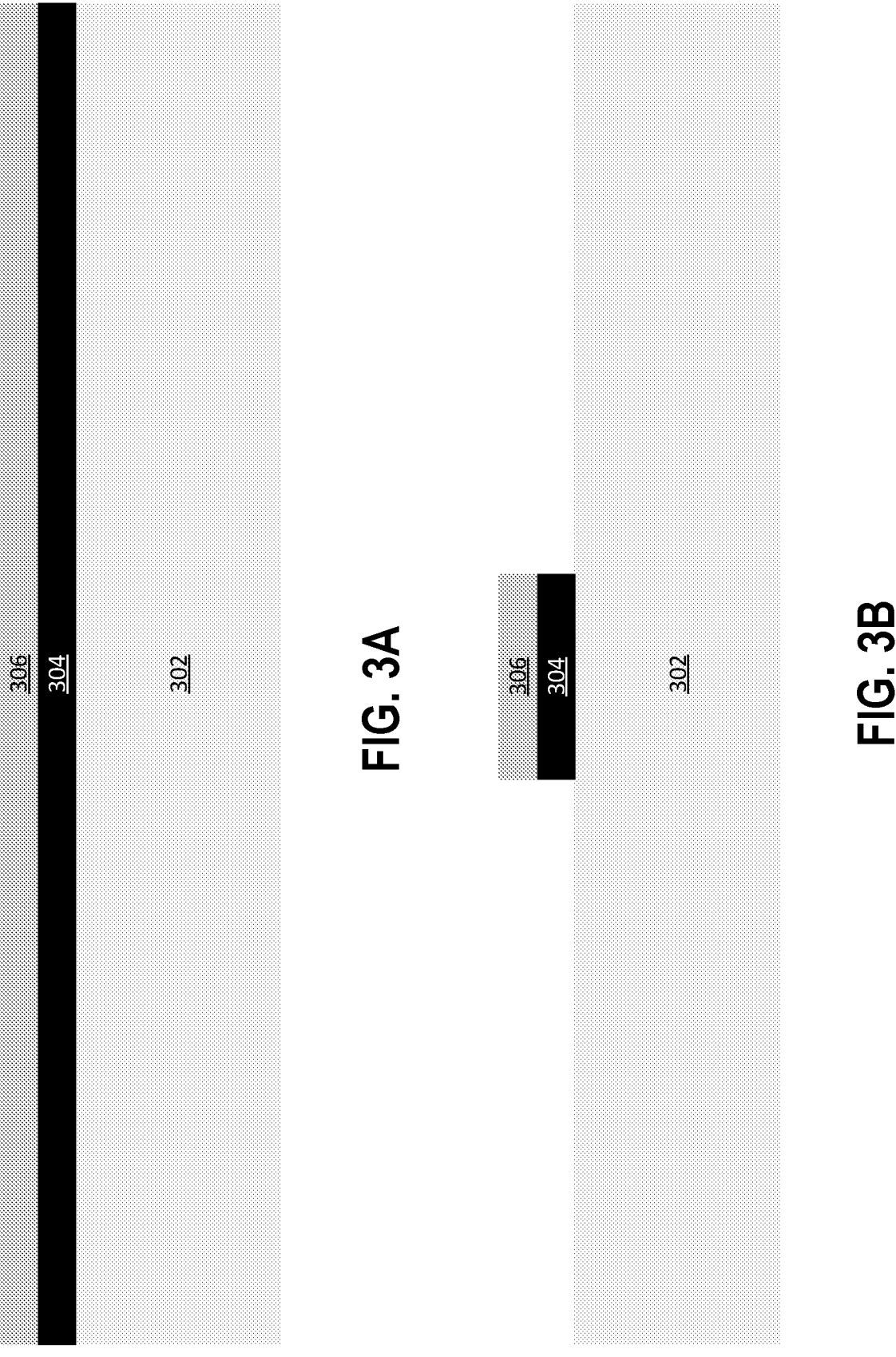
FIGS. 3A-J illustrates example process steps for fabricating a PCM device in accordance with the disclosure.
Figure 3C:
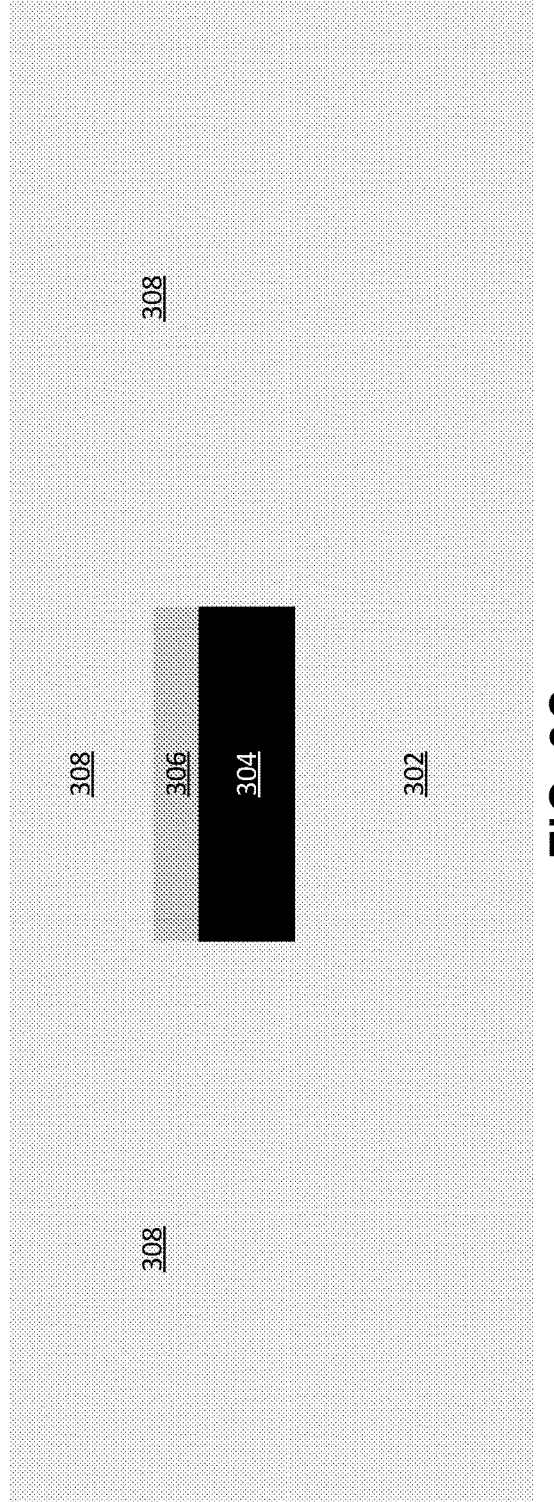
Figures 2, 3D:
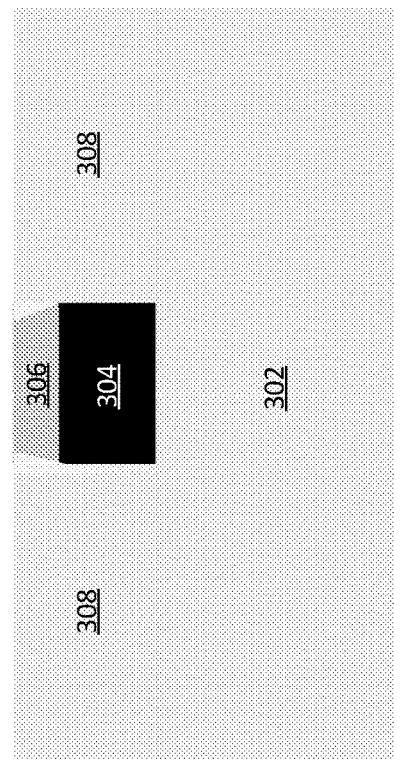
Figures 1, 3D:
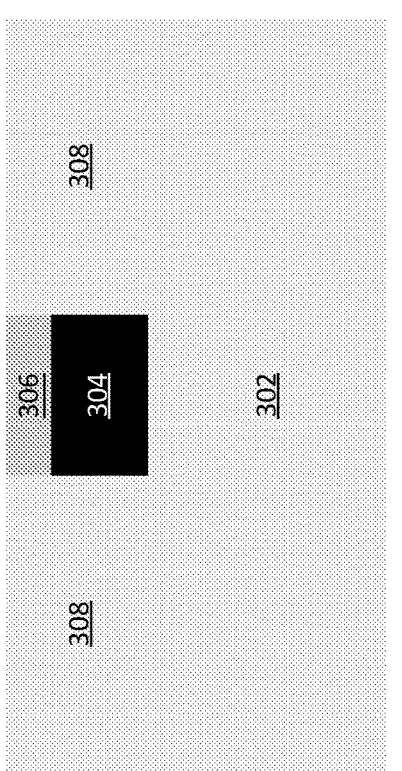
Figure 3E:
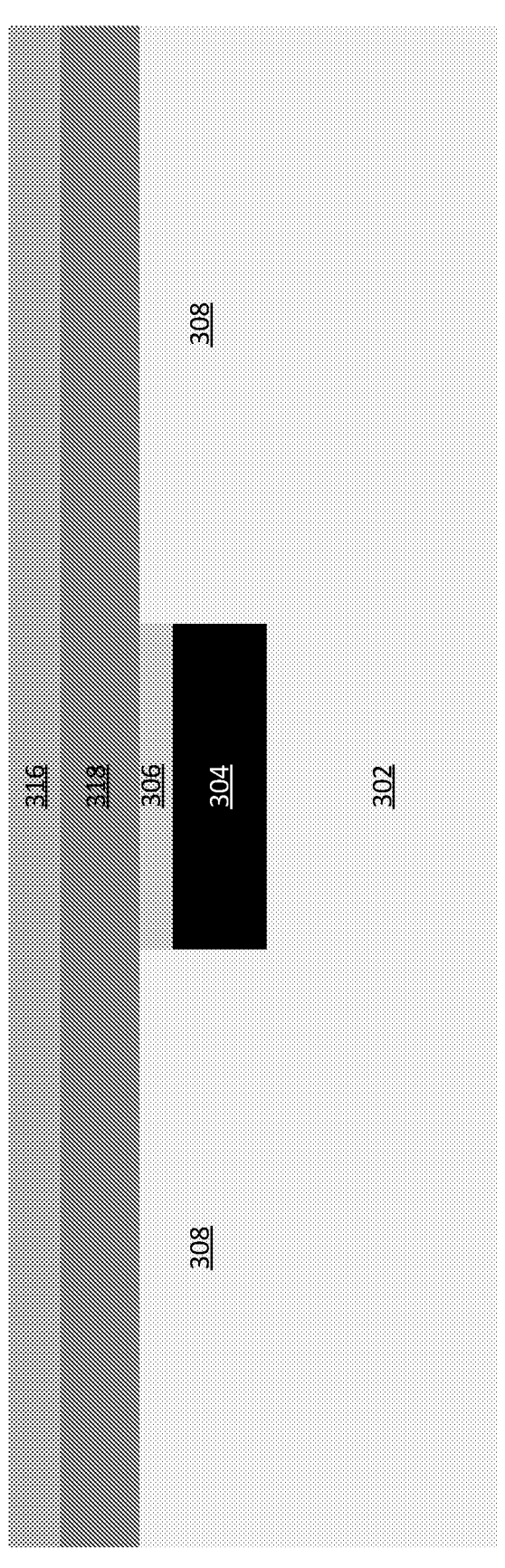
Figure 3F:
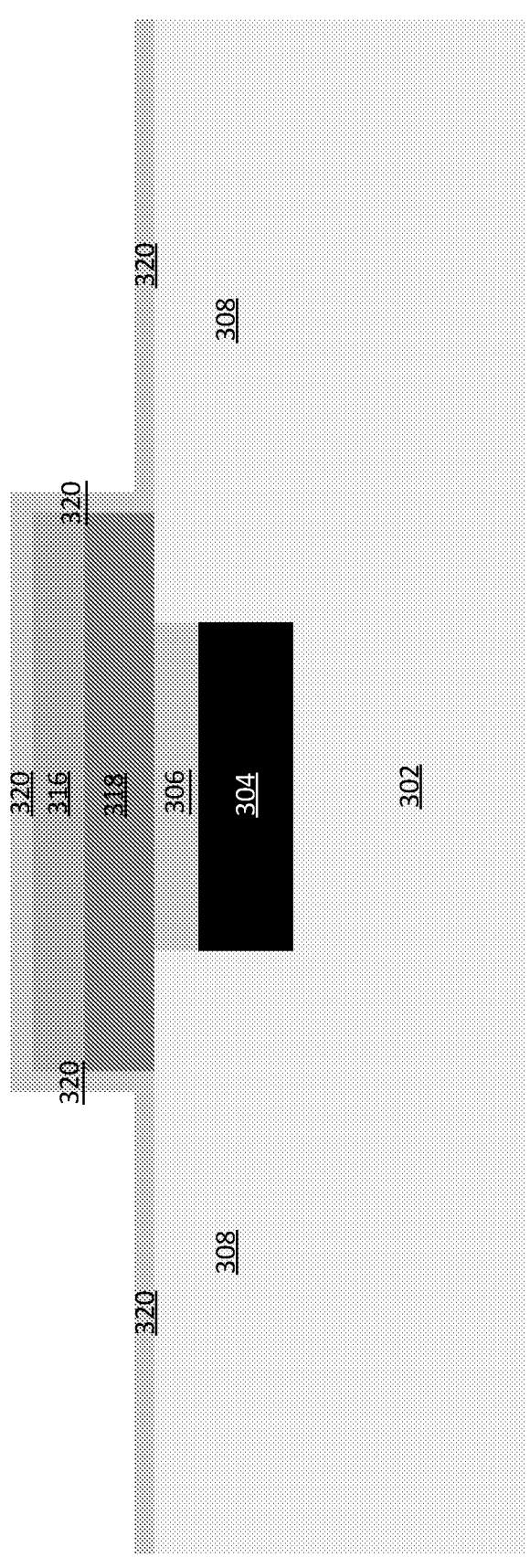
Figure 3G:
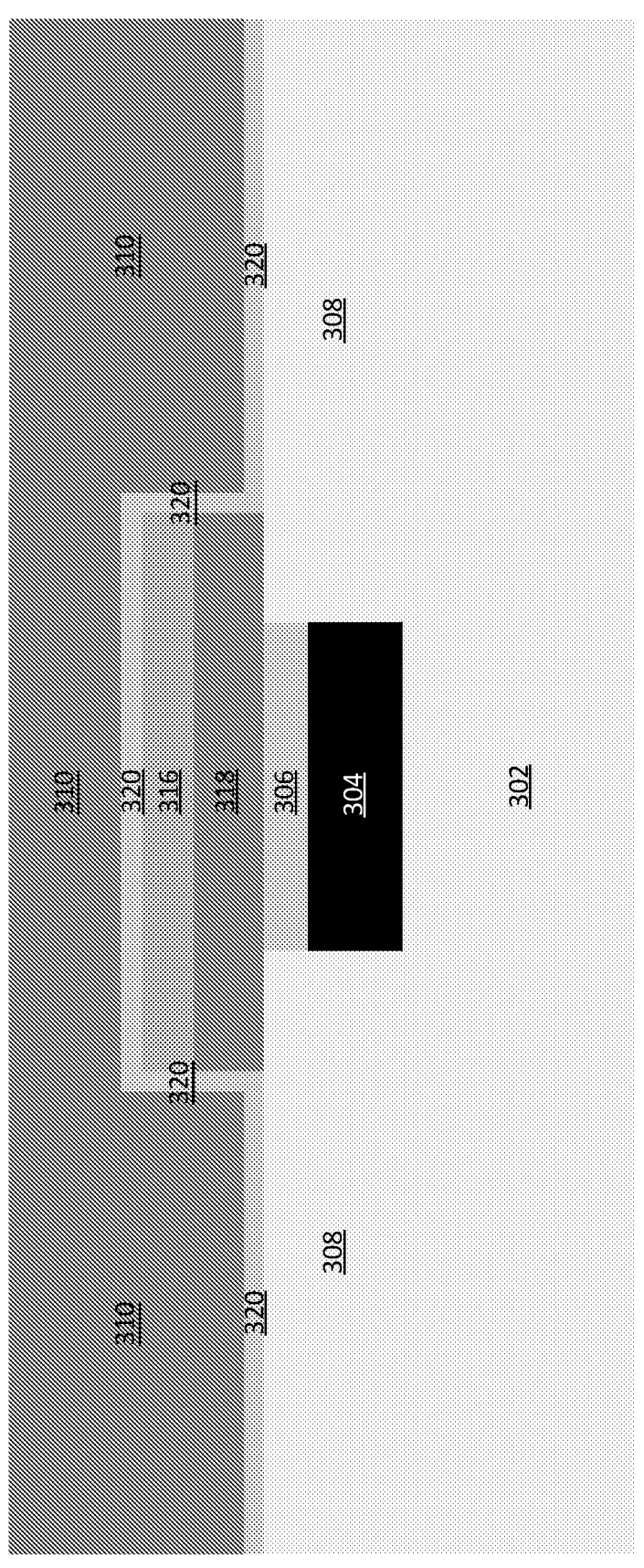
Figure 3H:
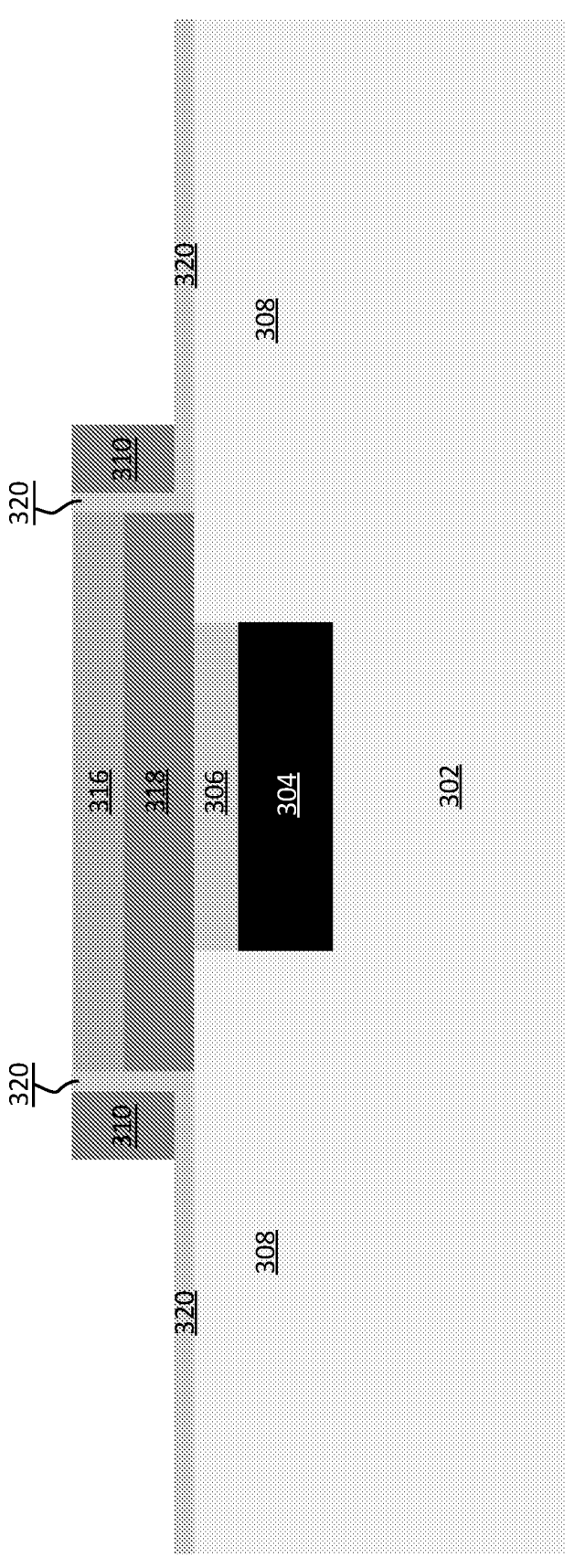
Figure 3I:
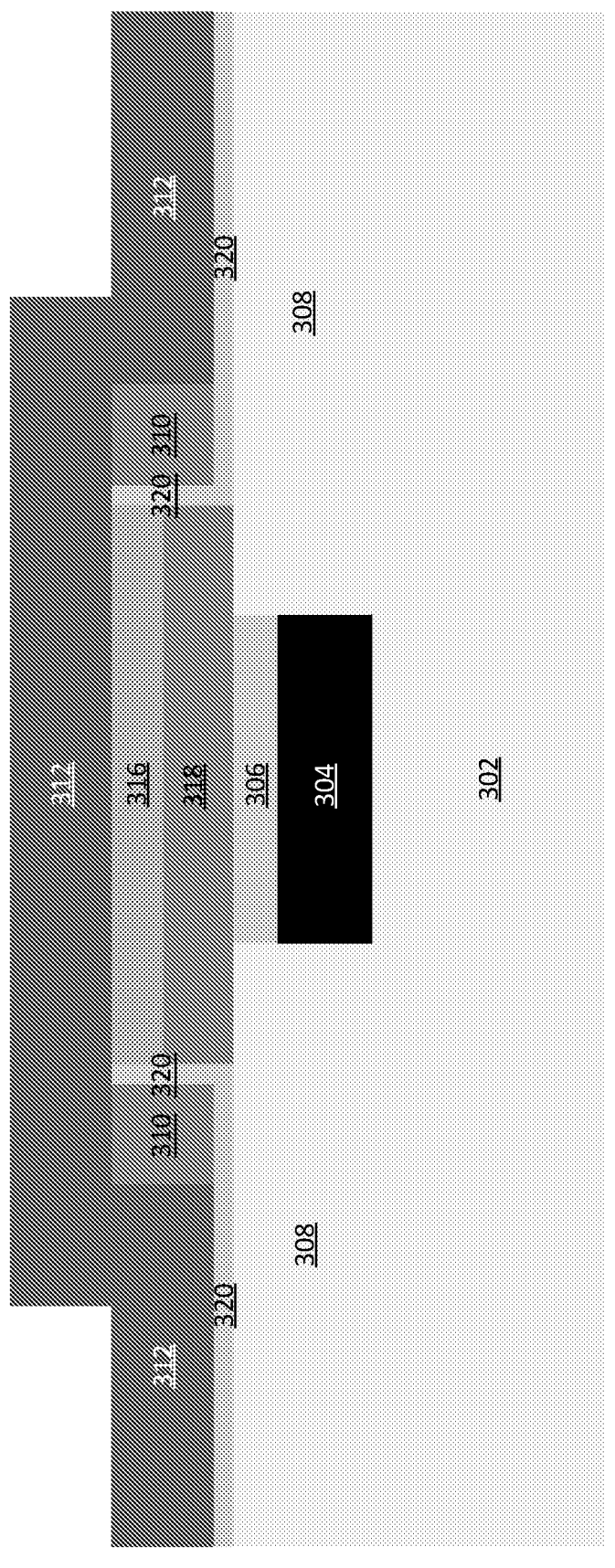
Figure 3J:
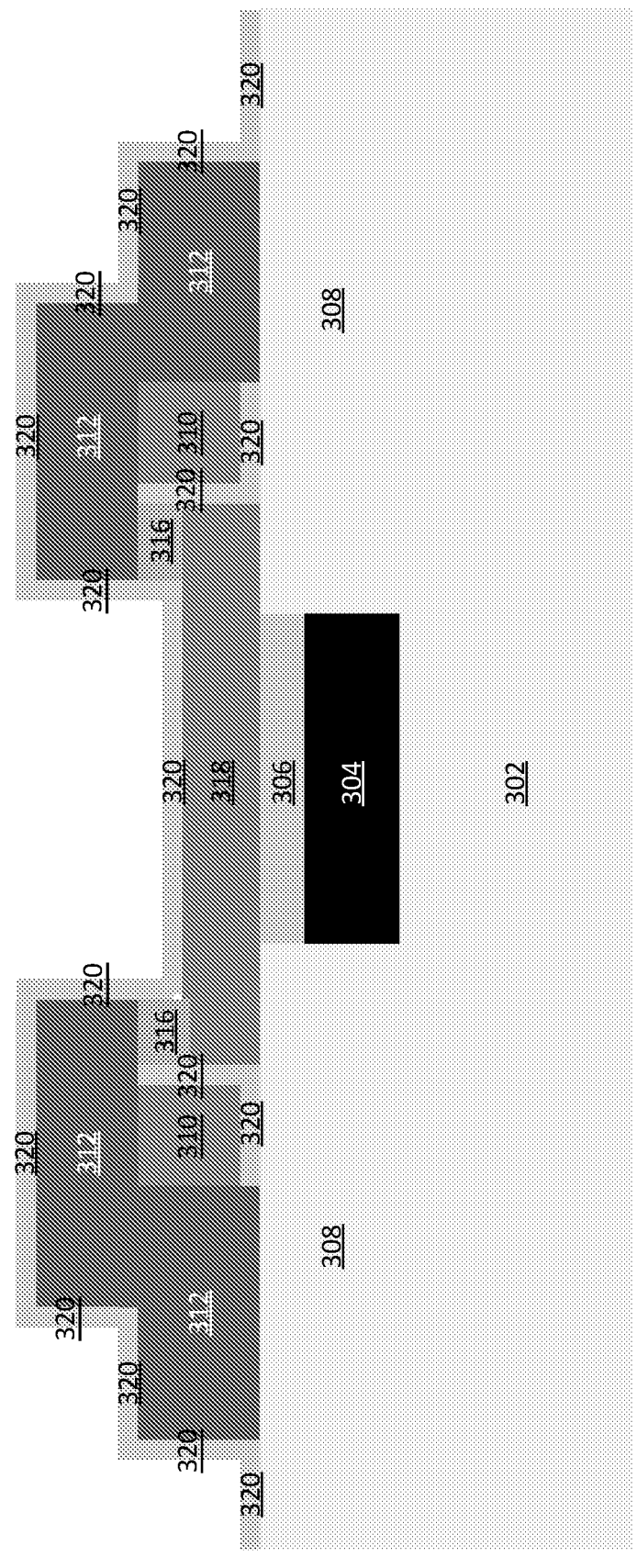
Figure 4:
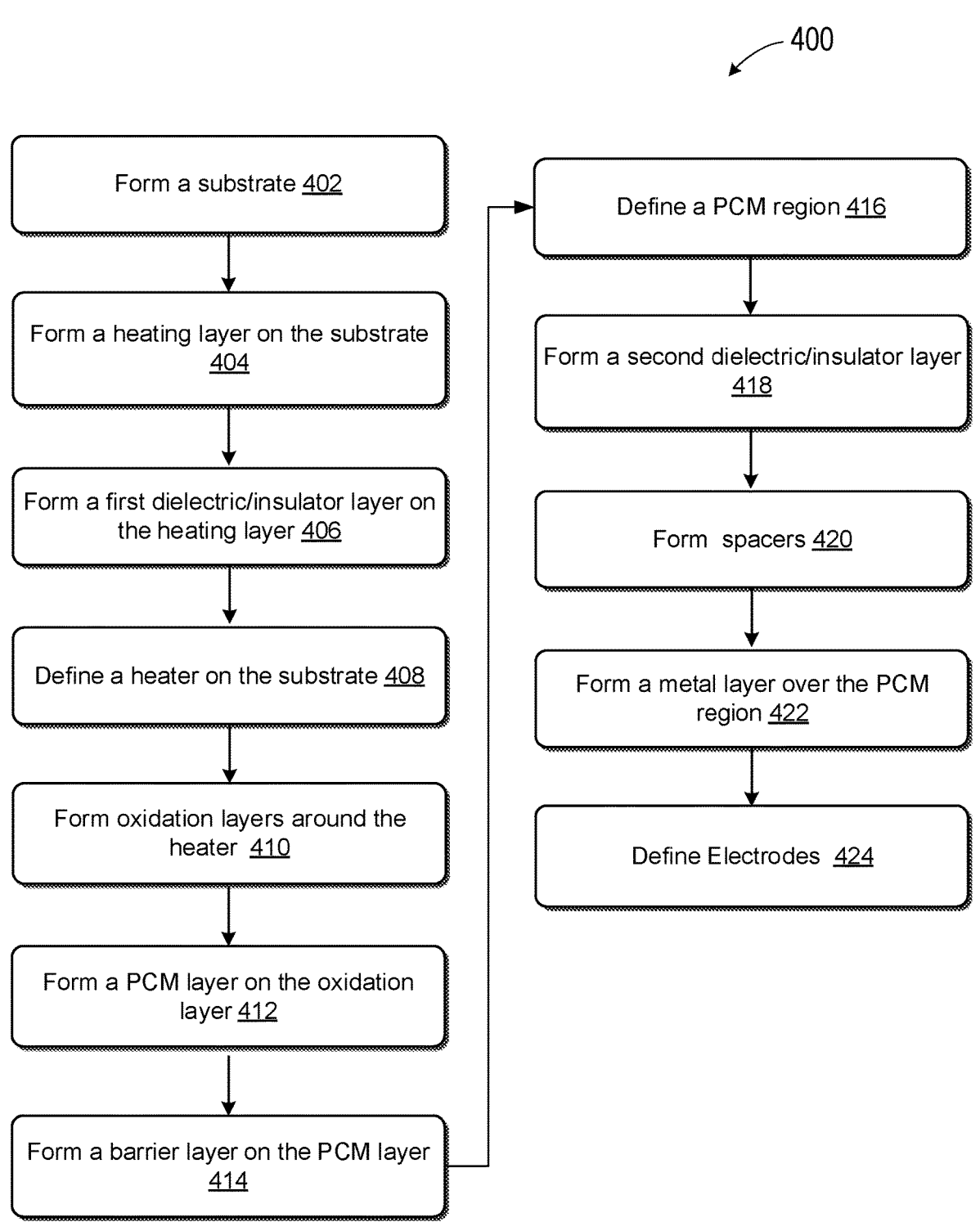
FIG. 4 is a flowchart illustrate a method for fabricating a PCM device in accordance with some embodiments.

FIG. 4 illustrates an example process for fabricating a PCM RF switch in accordance with some embodiments. FIGS. 3A-J illustrates steps described in FIG. 4. FIGS. 3 and 4 will be described in tandem to illustrate the process 400 shown in FIG. 4.

At 402, a substrate is formed. This is shown in FIG. 3A. The substrate 302 may be formed using a high-resistivity silicon substrate, such as Czochralski, float-zone, or epitaxial silicon substrate. In various implementations, the electrical resistivity of high resistivity silicon substrate 302 can range from approximately five hundred ohm-centimeters to approximately ten thousand ohm-centimeters (500Ω.cm-10,000 Ω.cm). In various implementations, high resistivity silicon substrate 302 can have a thickness of approximately seven hundred microns (700 μm) or greater or less. In various implementations, high resistivity silicon substrate 302 may be any other type of high resistivity substrate. For example, high resistivity silicon substrate 302 can comprise germanium (Ge), silicon germanium (SiXGeY), or silicon carbide (SiXCY). In one implementation, the thermal conductivity of high resistivity silicon substrate 302 can range from approximately one hundred fifty watts per meter-kelvin to approximately three hundred seventy watts per meter-kelvin (100 W/(m.K)-150 W/(m.K)). In some embodiments, the substrate 302 comprises SiC, USG oxide, and/or any other materials.

At 404, a heating layer 304 is formed on the substrate formed at 402. This is shown in FIG. 3A. In this embodiment, the heating layer 304 comprise Tungsten (W). In implementation, the heating layer 304 formed using direct current sputtering. In this process, the Tungsten based material is bombarded towards the substrate 302 with ionized gas molecules causing atoms to be "Sputtered" off into the plasma to form the heating layer 304. In some implementation, heating layer 304 has a thickness of approximately five hundred angstroms to approximately five thousand angstroms (500 Å-5000 Å). In one embodiment, heating layer 404 can has a width of approximately one quarter micron to approximately two and one half microns (0.25 μm-2.5 μm). In this embodiment, the heating layer 104 has a thickness of 150 nm.

At 406, a first dielectric/insulator layer is formed on the heating layer formed at 404. This is shown in FIG. 3A. In implementation, the first dielectric/insulator layer 306 is formed using plasma enhanced chemical vapor deposition (PECVF). In this embodiment, the dielectric/insulator layer 306 comprises SiN having a thickness 50 nm. However, this is also not limiting.

At 408, a heater is defined on the substrate formed in 402. This is shown in the FIG. 3B. In implementation, a photoresist mask can be used to pattern the heater 304 at a location desired for the PCM RF switch. As mentioned, the location of the heater 304 is typically under the PCM region of the PCM RF switch. In this example, the patterning process at

408 also patterns the dielectric/insulator layer 306 formed at 406. This is a novel step in the process 400 for fabricating the PCM RF switch. As mentioned, an insight provided by the present disclosure is that the dielectric/insulator layer 306 can be patterned just to cover a top surface of the heater 304 as shown in this example, rather than leaving it as a flat layer (such as the one shown in FIG. 3A) covering the heater 304.

At 410, oxidation layers are formed around the heater defined at 408. This is shown in FIG. 3C, FIG. 3D-1 and FIG. 3D-2. In FIG. 3A, in this example, $SiO_2$ is first filled into trenches around and above the combination of heater 304 and dielectric/insulator layer 106 to form the oxidation layers 308 as shown. Thereafter, in FIG. 3D-1, a chemical machine polishing (CMP) process is employed to make the oxidation layers 308 level with a surface of the dielectric/insulator layer 306. In this way, as mentioned, an oxidized confinement structure is formed around the combination of the heater 304 and the dielectric/insulator layer 306. In FIG. 3D-2, before filling the oxidized materials in the trenches at FIG. 3C, the dielectric/insulator layer 306 patterned at 408 can be processed to form a taper shape as shown in FIG. 3D-2. As mentioned above, the taper shaped dielectric/insulator layer 306 helps direct the heat from the heater 304 towards the PCM region.

At 412, a PCM layer is formed on the oxidation layers formed at 410. This is shown in FIG. 3E. As mentioned, PCM layer 318 comprises PCM materials such as Germanium based materials, such as Germanium telluride (GeX-TeY), germanium antimony telluride (GeXSbYTeZ), germanium selenide (GeXSeY), or any other chalcogenide. A thickness of the PCM layer 318 can range from 10 nm to 1000 nm in those embodiments. In this embodiment, the PCM layer 318 is about 100 nm thick. In implementation, one or more of the PCM materials can be dc-sputtered towards the surface defined by the oxidation layers 308 and the dielectric/insulator layer 306 to form the PCM layer 318.

At 414, a barrier layer is formed on the PCM layer formed at 412. This is shown in FIG. 3E. The barrier layer 316 comprises materials having good electric conductivity. In this embodiment, the barrier layer 316 formed using SiN. A purpose of the barrier layer 316 is to protect the PCM layer 318 from being exposed to the air after formation. Exposure to the air for an extended period could cause the PCM layer 318 to degrade. In this example, the barrier layer 316 is about 50 nm thick. It is contemplated that a PCM RF switch in accordance with the present disclosure having a thermal confinement structure may not have a barrier layer arranged on top of the PCM layer. Nevertheless, such a PCM device is still in the scope of the present disclosure.

At 418, a PCM region is defined. This is shown in FIG. 3F. As shown, the PCM region 318 is defined along with barrier 316 to cover an area above the combination of heater 304 and 306. In implement, another photoresist mask can be used to define the PCM region 316. In this example, a striker layer 320 is formed on the surface of the oxidation layers 308, the sides of the combination of the PCM region 318 and the barrier 316, and a surface of the barrier 316. The striker 320 serves as another protection of the PCM region 318 on the sides. In this example, the striker 320 is about 20 nm thick and comprises Si based materials. It is contemplated that some PCM devices in accordance with the present disclosure do not have to have the striker 320 shown in this example. Nevertheless those PCM devices are still within the scope of the present disclosure.

At 418, a second dielectric/insulator layer is formed over the striker layer. This is shown in FIG. 3G. As shown, the second dielectric/insulator layer 310 is deposited on the surface defined by the striker 320. In implementation, the second dielectric/insulator layer 310 may have similar material(s) to that of the dielectric/insulator layer 306. In this embodiment, the dielectric/insulator layer 306 has a thickness around 50 nm.

At 420, spacers are formed. This is shown in FIG. 3H. As can be seen, the spacers 310 are formed along the sides of the combination of the PCM region 318 and the dielectric/insulator layer 306. In implementation, an etching process (such as a dry etch) can be used to define the spacers 310 and remove the striker on the barrier 316.

At 422, a metal layer is formed over the barrier and the spacer formed at 418 and 420 respectively. This is shown in FIG. 3I. As shown, the metal layer 312 is deposited on the striker 320, the spacers 310, and the barrier 316. In this example, the metal layer comprises Tungsten having a thickness of 400 nm.

At 424, electrodes of the PCM RF switch are formed to define a electrical path of the PCM device. This is shown in FIG. 3J. In implementation, a photoresist mask can be used to define the electrodes 312 and remove the portion of the barrier layer 316 over the PCM region 318. In this example, another striker 320 is formed on the PCM region 318 and electrodes 320 after the barrier layer 316 is removed to serve as a cap.

It is understood although PCM RF switch is used to describe various embodiments for improving heating efficiency in a PCM region, the present disclosure is not limited to PCM RF switch. It is contemplated that the heat retention structure for improving the heating efficiency in a PCM RF switch described and illustrated herein can be applied to any other types of PCM devices that use a heater to heat a PCM region in the PCM devices. For example, the layer 202 under the heater 104 is contemplated to be in various embodiments where a phase-change memory device uses a heater to heat a PCM region in the phase-change memory device.

In various embodiments, a phase change material (PCM) radio frequency (RF) switch is provided. In those embodiments, the PCM RF switch comprises a substrate, a heater element formed above the substrate, a dielectric layer formed on the heater element, oxidation layers formed on the substrate and around the heater element and the dielectric layer. In those embodiments, the upper surfaces of the oxidation layers are co-planar with an upper surface of the dielectric layer, a PCM region formed on the dielectric layer, the PCM region is wider than the heater element, and electrodes are formed around the PCM region and on the oxidation layers.

In various embodiments, a method for forming a phase change material (PCM) radio frequency (RF) switch is provided. In those embodiments, the method comprises forming a substrate; forming a heater element above the substrate; forming a dielectric layer on the heater element; forming oxidation layers on the substrate and around the heater element and the dielectric layer; forming a PCM region on the dielectric layer; and forming electrodes around the PCM region and on the oxidation layers. In those embodiments, the upper surfaces of the oxidation layers are co-planar with an upper surface of the dielectric layer, and the, and the PCM region is wider than the heater element.

In various embodiment, a phase change material (PCM) device is provided. In those embodiments, the PCM device comprises a substrate; a heater element is formed above the substrate, a dielectric layer formed on the heater element, oxidation layers are formed on the substrate and around the heater element and the dielectric layer, a PCM region is formed on the dielectric layer and. In those embodiments, the upper surfaces of the oxidation layers are co-planar with an upper surface of the dielectric layer, the PCM region is wider than the heater element, and the electrodes and the PCM region defines a radio frequency path for the PCM RF switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change material (PCM) radio frequency (RF) switch comprising:
   a substrate;
   a heater element formed above the substrate;
   a dielectric layer formed on the heater element;
   oxidation layers formed on the substrate and around the heater element and the dielectric layer, wherein upper surfaces of the oxidation layers are co-planar with an upper surface of the dielectric layer;
   a PCM region formed on the dielectric layer, wherein the PCM region is wider than the heater element;
   spacers formed on the oxidation layers and along sidewalls of the PCM region; and
   electrodes formed around the PCM region and over the spacers.

2. The PCM RF switch of claim 1, wherein the oxidation layers have a lower thermal conductivity than a thermal conductivity of the dielectric layer.

3. The PCM RF switch of claim 1, wherein the oxidation layers comprise a first oxidation layer arranged on a right side of the heater element and a second oxidation layer arranged on a left side of the heater element.

4. The PCM RF switch of claim 1, wherein the oxidation layers comprise a Silicon Oxide based material.

5. The PCM RF switch of claim 1, wherein the oxidation layers have a thickness equal to a combination of a thickness of the heater element and a thickness of the dielectric layer.

6. The PCM RF switch of claim 1, further comprising an insulation layer formed between the heater element and the substrate.

7. The PCM RF switch of claim 6, wherein the insulation layer has a lower thermal conductivity than that of the substrate.

8. The PCM RF switch of claim 1, wherein the dielectric layer has a tapered shape tapering towards the PCM region.

9. The PCM RF switch of claim 6, wherein the insulation layer is operable to confine thermal energy generated by the heater element.

10. The PCM RF switch of claim 6, wherein the insulation layer comprises a nitride-based material.

11. The PCM RF switch of claim 1, wherein the oxidation layers are operable to confine thermal energy generated by the heater element.

12. A phase change material (PCM) device, comprising:
   a substrate;
   a heater element formed above the substrate;
   a dielectric layer formed on the heater element;
   oxidation layers formed on the substrate and around the heater element and the dielectric layer, wherein upper surfaces of the oxidation layers are coplanar with an upper surface of the dielectric layer;
   a PCM region formed on the dielectric layer, wherein the PCM region is wider than the heater element;
   spacers formed on the oxidation layers and along sidewalls of the PCM region; and
   electrodes formed around the PCM region and over the spacers, wherein the electrodes and the PCM region defines a radio frequency path for the PCM device.

13. The PCM device of claim 12, wherein the oxidation layers have a lower thermal conductivity than a thermal conductivity of the dielectric layer.

14. The PCM device of claim 12, wherein the oxidation layers comprise a first oxidation layer arranged on a right side of the heater element and a second oxidation layer arranged on a left side of the heater element.

15. The PCM device of claim 14, wherein the oxidation layers comprise a Silicon Oxide based material.

16. The PCM device of claim 12, wherein the oxidation layers are operable to confine thermal energy generated by the heater element.

17. The PCM device of claim 12, further comprising an insulation layer formed between the heater element and the substrate.

18. The PCM device of claim 12, wherein the dielectric layer has a tapered shape tapering towards the PCM region.

19. A phase change material (PCM) device, comprising:
   a substrate;
   a heater element disposed on the substrate, a lower surface of the heater element being coplanar with an upper surface of the substrate;
   a dielectric layer disposed on the heater element;
   at least one oxidation layer disposed on the substrate and around the heater element and the dielectric layer, wherein upper surfaces of the at least one oxidation layer are coplanar with an upper surface of the dielectric layer;
   a PCM region formed on the dielectric layer, wherein the PCM region is wider than the heater element; and
   spacers formed on the at least one oxidation layer and along sidewalls of the PCM region.

20. The PCM device of claim 19, wherein the dielectric layer is characterized by a first thermal conductivity, and the at least one oxidation layer is characterized by a second thermal conductivity lower than the first thermal conductivity.

* * * * *